United States Patent
Mane et al.

(10) Patent No.: US 11,142,824 B2
(45) Date of Patent: Oct. 12, 2021

(54) METHOD OF PRODUCING THIN LAYER OF LARGE AREA TRANSITION METAL DICHALCOGENIDES $MOS_2$ AND OTHERS

(71) Applicant: UCHICAGO ARGONNE, LLC, Chicago, IL (US)

(72) Inventors: Anil U. Mane, Naperville, IL (US); Devika Choudhury, Naperville, IL (US); Jeffrey W. Elam, Elmhurst, IL (US); Steven Payonk Letourneau, Naperville, IL (US)

(73) Assignee: UChicago Argonne, LLC, Chicago, IL (US)

( * ) Notice: Subject to any disclaimer, the term of this patent is extended or adjusted under 35 U.S.C. 154(b) by 216 days.

(21) Appl. No.: 16/391,876

(22) Filed: Apr. 23, 2019

(65) Prior Publication Data

US 2020/0340119 A1    Oct. 29, 2020

(51) Int. Cl.
  *C23C 16/56*    (2006.01)
  *C23C 16/14*    (2006.01)
  *C23C 16/455*   (2006.01)

(52) U.S. Cl.
  CPC ............ *C23C 16/56* (2013.01); *C23C 16/14* (2013.01); *C23C 16/45527* (2013.01); *C23C 16/45553* (2013.01)

(58) Field of Classification Search
  CPC .......... C23C 16/0272; C23C 16/45527; C23C 16/45553
  See application file for complete search history.

(56) References Cited

U.S. PATENT DOCUMENTS

| | | | |
|---|---|---|---|
| 2013/0280546 A1* | 10/2013 | Elam | C23C 16/30 428/472.2 |
| 2015/0211112 A1 | 7/2015 | Cadot et al. | |
| 2015/0333200 A1 | 11/2015 | Chirila et al. | |
| 2016/0005963 A1 | 1/2016 | Kim | |
| 2016/0122868 A1 | 5/2016 | Kim et al. | |
| 2016/0168694 A1 | 6/2016 | Min | |
| 2017/0011915 A1 | 1/2017 | Cannara et al. | |
| 2017/0133547 A1 | 5/2017 | Reinhard et al. | |
| 2017/0243993 A1 | 8/2017 | Reinhard et al. | |
| 2017/0250075 A1* | 8/2017 | Caymax | H01L 21/02658 |
| 2017/0267527 A1 | 9/2017 | Kim et al. | |
| 2018/0105930 A1 | 4/2018 | Kang et al. | |
| 2018/0127873 A1 | 5/2018 | Sarnet et al. | |
| 2018/0269291 A1 | 9/2018 | Lin et al. | |
| 2019/0279870 A1 | 9/2019 | Mane et al. | |

(Continued)

FOREIGN PATENT DOCUMENTS

WO    WO-2015/091781 A2    6/2015

OTHER PUBLICATIONS

Seghete Chem Mater 2011 v23 p. 1668-1678 (Year: 2011).*

(Continued)

*Primary Examiner* — Joseph A Miller, Jr.
(74) *Attorney, Agent, or Firm* — Foley & Lardner LLP

(57) ABSTRACT

An ultra-thin film transition metal dichalcogenide ("TMD") supported on a support. The TMD is formed from a metal grown by atomic layer deposition ("ALD") on a substrate. The metal is sulphurized to produce a TMD ultra-thin layer.

16 Claims, 7 Drawing Sheets

(56) References Cited

U.S. PATENT DOCUMENTS

2020/0340119 A1    10/2020    Mane et al.
2021/0087677 A1    3/2021    Wong et al.

OTHER PUBLICATIONS

Zhan Small 2012 vol. 8 No. 7 p. 966-971 (Year: 2012).*
Zhan Small 2012 vol. 8 No. 7 supporting info (Year: 2012).*
Agrawal, et al. "Fast detection and low power hydrogen sensor using edge-oriented vertically aligned 3-D network of MoS2 flakes at room temperature," Applied Physics Letters 111, 093102, 6 pages (2017).
Browning, et al., "Atomic layer deposition of MoS2 thin films," Materials Research Express 2(3), 5 pages (2015).
Chhowalla, et al., "The chemistry of two-dimensional layered transition metal dichalcogenide nanosheets," Nature Chemistry 5, pp. 263-275 (2013).
Delabie, et al., "Low temperature deposition of 2D WS2 layers from WF6 and H2S precursors: impact of reducing agents," Chemical Communications 51, pp. 15692-5695 (2015).
Domask, et al., "Transition Metal-MoS2 Reactions: Review and Thermodynamic Predictions," Journal of Electronic Materials 44(11), pp. 4065-4079 (2014).
Dong, et al., "Review Article: Progress in fabrication of transition metal dichalcogenides heterostructure systems featured," J. Vac. Sci. Technol. B, 35(3), 15 pages (May/Jun. 2017).
Eda, et al., "Photoluminescence from Chemically Exfoliated MoS2," Nano Lett., 11(12), pp. 5111-5116 (2011).
Elam, et al., "Viscous flow reactor with quartz crystal microbalance for thin film growth by atomic layer deposition," Review of Scientific Instruments 73, 2981 (2002).
Feng, et al., "Synthesis of Large-Area Highly Crystalline Monolayer Molybdenum Disulfide with Tunable Grain Size in a H2 Atmosphere," ACS Appl. Mater. Interfaces 7(40), pp. 22587-22593 (2015).
George, "Atomic layer deposition: an overview," Chemical Reviews 110(1), pp. 111-131 (2010).
Grubbs, et al., "Nucleation and growth during the atomic layer deposition of W on Al2O3 and Al2O3 on W," Thin Solid Films 467(1-2), pp. 16-27 (2004).
Hegner, et al., "Ultralarge atomically flat template-stripped Au surfaces for scanning probe microscopy," Surface Science 291(1-2), pp. 39-46 (1993).
Helveg, et al., "Atomic-Scale Structure of Single-Layer MoS2 Nanoclusters," Physical Review Letters 84, p. 951 (Jan. 31, 2000).
Imanishi, et al., "Synthesis of MoS2 Thin Film by Chemical Vapor Deposition Method and Discharge Characteristics as a Cathode of the Lithium Secondary Battery," Journal of the Electrochemical Society 139(8), pp. 2082-2087 (1992).
Jang, et al., "Wafer-scale, conformal and direct growth of MoS2 thin films by atomic layer deposition," Applied Surface Science 365, pp. 160-165 (2016).
Jin, et al., "Novel chemical route for atomic layer deposition of MoS2 thin film on SiO2/Si substrate," Nanoscale 6(23), pp. 14453-14458 (2014).
Joensen, et al., "Single-layer MoS2," Materials Research Bulletin 21(4), pp. 457-461 (1986).
Jurca, et al., "Low-Temperature Atomic Layer Deposition of MoS2 Films," Angewandte Chemie International Edition 56(18), pp. 4991-4995 (2017).
Kam, et al., "Detailed photocurrent spectroscopy of the semiconducting group VIB transition metal dichalcogenides," the Journal of Physical Chemistry 86(4), pp. 463-467 (1982).
Kumar, et al., "Reaction mechanism of core-shell MoO2/MoS2 nanoflakes via plasma-assisted sulfurization of MoO3," Materials Research Express 3(5) (2016).
Lee, et al., "Crystal orientation and near-interface structure of chemically vapor deposited MoS2 films," Journal of Materials Research 10(1), pp. 49-53 (1995).
Lee, et al., "Preparation of MoS2 thin films by chemical vapor deposition," Journal of Materials Research 9(6), pp. 1474-1483 (1994).
Li, et al. "Inkjet Printing of MoS2," Advanced Functional Materials 24(41), pp. 6524-6531 (2014).
Li, et al., "From Bulk to Monolayer MoS2: Evolution of Raman Scattering," Advanced Functional Materials 22(7), pp. 1385-1390 (2012).
Lifshitz, et al., "Selective Molybdenum Deposition by LPCVD," Journal of the Electrochemical Society 134(8), pp. 2061-2067 (1987).
Mane, "Atomic layer deposition of molybdenum disulfide films using MoF6 and H2S," Journal of Vacuum Science & Technology A 36, 01A125, 9 pages (2018).
Mattinen, et al., "Atomic Layer Deposition of Crystalline MoS2 Thin Films: New Molybdenum Precursor for Low-Temperature Film Growth," Advanced Materials Interfaces 4(18), 11 pages (2017).
Mattinen, et al., "Atomic Layer Deposition of Crystalline MoS2 Thin Films: New Molybdenum Precursor for Low-Temperature Film Growth," Advanced Materials Interfaces 4(18), 1700123, 11 pages (2017).
Muratore, et al., "Continuous ultra-thin MoS2 films grown by low-temperature physical vapor deposition," Applied Physics Letters 104, 261604 (2014).
Nandi, et al., "Atomic Layer Deposited MoS2 as a Carbon and Binder Free Anode in Li-ion Battery," Electrochimica Acta 146, pp. 706-713 (2014).
Novoselov, et al. "Electric Field Effect in Atomically Thin Carbon Films," Science 306(5696), pp. 666-669 (2004).
O'Neill, et al., "Preparation of High Concentration Dispersions of Exfoliated MoS2 with Increased Flake Size," Chemistry of Materials 24(12), pp. 2414-2421 (2012).
Pyeon, et al., "Wafer-scale growth of MoS2 thin films by atomic layer deposition," Nanoscale 8, pp. 10792-10798 (2016).
Qin, et al., "In situ growth of double-layer MoO3/MoS2 film from MoS2 for hole-transport layers in organic solar cell," Journal of Materials Chemistry A 2, pp. 2742-2756 (2014).
Radisavljevic, et al., "Single-layer MoS2 transistors," Nature Nanotechnology 6, pp. 147-150 (2011).
Ross & Sussman, "Surface Oxidation of Molybdenum Disulfide," the Journal of Physical Chemistry 59(9), pp. 889-892 (1955).
Rowley-Neale, et al., "2D nanosheet molybdenum disulphide (MoS2) modified electrodes explored towards the hydrogen evolution reaction," Nanoscale 7, pp. 18152-18168 (2015).
Scharf, et al., "Atomic layer deposition of tungsten disulphide solid lubricant thin films," Journal of Materials Research 19(12), pp. 3443-3446 (2004).
Scharf, et al., "Growth, structure, and tribological behavior of atomic layer-deposited tungsten disulphide solid lubricant coatings with applications to MEMS," Acta Materialia 54(18), pp. 4731-4743 (2006).
Seghete, et al., "Molybdenum Atomic Layer Deposition Using MoF6 and Si2H6 as the Reactants," Chemistry of Materials 23(7), pp. 1668-1678 (2011).
Spalvins, "A review of recent advances in solid film lubrication," Journal of Vacuum Science & Technology A: Vacuum, Surfaces, and Films 5(2), pp. 212-219 (1987).
Splendiani, et al., "Emerging Photoluminescence in Monolayer MoS2," Nano Letters 10 (4), pp. 1271-1275 (2010).
Tan, et al., "Atomic layer deposition of a MoS2 film," Nanoscale 6, pp. 10584-10588 (2014).
Tenne, "Advances in the Synthesis of Inorganic Nanotubes and Fullerene-Like Nanoparticles," Angewandte Chemie International Edition 42, pp. 5124-5132 (2003).
Valdivia, "Atomic layer deposition of two dimensional MoS2 on 150 mm substrates," Journal of Vacuum Science & Technology A: Vacuum, Surfaces, and Films 34, 021515 (2016).
Vila, et al., "Bottom-up synthesis of vertically oriented two-dimensional materials," 2D Materials 3(4) (2016).
Voiry, et al., "Conducting MoS2 Nanosheets as Catalysts for Hydrogen Evolution Reaction," Nano Letters 13(12), pp. 6222-6227 (2013).

(56) References Cited

OTHER PUBLICATIONS

West & Menzies, "The Vapor Pressures of Sulphur between 100 and 550 with related Thermal Data," the Journal of Physical Chemistry 33(12), pp. 1880-1892 (1929).

Wu, et al., "Establishment of 2D Crystal Heterostructures by Sulfurization of Sequential Transition Metal Depositions: Preparation, Characterization, and Selective Growth," Nano Letters 16(11), pp. 7093-7097 (2016).

Wypych, et al., "1T—MoS2, a new metallic modification of molybdenum disulfide," Journal of the Chemical Society: Chemical Communications 0, pp. 1386-1388 (1992).

Yu, et al., "Controlled Scalable Synthesis of Uniform, High-Quality Monolayer and Few-layer MoS2 Films," Scientific Reports 3, 6 pages (2013).

Browning, R., "Atomic Layer Deposition of MoS2 thin films." Materials Research Express, 2 (2015), 0035006, pp. 1-5.

Cao, et al., "Area-Selective Growth of HfS2 Thin Films via Atomic Layer Deposition at Low Temperature." Adv. Mater. Interfaces 2020, 2001493, pp. 1-9.

Chae, S. et al., "Oxidation Effect in Octahedral Hafnium Disulfide Thin Film." ACS Nano 2016, 10, pp. 1309-1316.

Huang, Y., et al., "Recent progress in atomic layer deposition of molybdenum disulfide: a mini review." Science China Materials, 2019, 62(7): pp. 913-924.

Jang, Y., et al., "Wafer-scale, conformal and direct growth of MoS2 thin films by atomic layer deposition." Applied Surface Science, 365 (2016), pp. 160-165.

Mane, A., et al., "Atomic layer deposition of molybdenum disulfide films using MoF6 and H2S." J. Vac. Sci. Technol. A 36(1), Jan./Feb. 2018, 01A125-1 to 01A125-9.

Mattinen, et al., "Atomic Layer Deposition of Emerging 2D Semiconductors, HfS2 and ZrS2, for Optoelectronics," Chem. Mater. 2019, 31, pp. 5713-5724.

Seghete, D., et al., "Molybdenum Atomic Layer Deposition Using MoF6 and Si2H6 as the Reactants." Chem. Mater. 2011, 23, pp. 1668-1678.

\* cited by examiner

|  |  | MoS$_2$ | Mo | AlMo | SiO$_2$ |
|---|---|---|---|---|---|
| 1 Cycle | Density | 5.92 | 8.17 | 2.26 | 3.10 |
|  | Thickness (A) | 0.54 | 0.51 | 9.74 | 22.5 |
|  | Roughness | 10 | 9.1 | 7.65 | 12.2 |
| 2 Cycles | Density | 6.89 | 10.14 | 2.46 | 3.3 |
|  | Thickness (A) | 6.95 | 2.99 | 14.19 | 24.9 |
|  | Roughness | 9.85 | 8.07 | 12.32 | 8.01 |
| 3 Cycles | Density | 5.23 | 9.22 | 1.99 | 2.31 |
|  | Thickness (A) | 7.17 | 1.51 | 15.40 | 19.36 |
|  | Roughness | 24.4 | 11.3 | 15.19 | 9.76 |

METHOD OF PRODUCING THIN LAYER OF LARGE AREA TRANSITION METAL DICHALCOGENIDES $MOS_2$ AND OTHERS

STATEMENT OF GOVERNMENT INTEREST

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates generally to transition metal dichalcogenides, specifically, method of producing thin layer metal dichalcogenides.

BACKGROUND

Two dimensional ("2D") materials, like graphite, are layered materials featuring strong covalent bonds within the layers and weak van der Waals bonds between them. Moreover, these materials are able to be isolated to a single layer, such as graphene (a single layer of graphite). The contrasting bonding characteristics give rise to unique chemical, optical, electrical, magnetic, and mechanical properties. Graphene has been the most attractive 2D material for quite some time, with a great amount of resources and effort directed to its development. However, limited success in scale-up and commercialization has limited its integration into graphene-based products. Thus, driving the search of alternate 2D materials.

Transition metal dichalcogenides ("TMDs") are one such sub group of 2D materials that could possibly replace graphene. Unlike graphene, which consists of a single layer of covalently bonded carbon atoms, TMDs consists of a single layer of metal atoms sandwiched between two layers of chalcogenides. One of the largest limitations of graphene is that it lacks a bandgap, which is required for integration into electronics. The structural configuration of TMDs can overcome this and exhibits desirable properties, such as a high mobility and tunable optical and electronic bandgaps, making them useful in a wide range of applications, such as electronic devices, electrochemical storage devices, tribological materials, sensors, and the like.

Currently there is a great interest in 2D TMDs, such as $MoS_2$, $WS_2$, and $MoSe_2$, due to their graphene-like properties and other definite advantages, such as tunable bandgaps, high carrier mobility, and electrochemical properties. Due to the structure of TMDs, bulk crystals have typically been harvested by micromechanical cleavage or chemical processes inspired by processes used with other materials, such as graphite/graphene, to provide atomically thin flakes. For example, existing work on layered-TMDs rely on (i) flakes produced by exfoliation from bulk, (ii) synthesis by high temperature (800° C.-1000° C.) chemical vapor deposition, or (iii) solution based methods.

The quickest and most common path of obtaining ultra-thin sheets of 2D TMDs is based on the top-down approach of exfoliation. For example, a common method used in smaller scale situations, such as research projects, is to utilize adhesive tape to exfoliate thin flakes from bulk crystals, such as how graphene was isolated from graphite bulk. Other similar techniques using a mechanical exfoliation or cleavage are also known. To date, such methods have been sufficient for demonstrating novel material properties and advancing our technological understanding in various fields such as power electronics, energy harvesting, diodes, photodetectors, flexible electronics, and sensors. However, the key to unlocking this great potential in device fabrication necessitates a new synthesis approach and circumventing the major scalability issue of exfoliation and high temperature processing requirements, which is simply impractical from large-scale manufacturing point of view. Other challenges include harnessing the complex interfaces of 2D TMDs with growing substrate materials and subsequent deposited layers, good electrical contacts, intrinsic material defects and impurities during material synthesis, and a systematic understanding of basic material synthesis at the growth level.

Each of these methods fails to provide a TMD material with sufficient quality and precision of control (most notably for thickness).

SUMMARY

One embodiment relates to a method of preparing a substrate comprising: forming an ultra-thin transition metal layer. The metal layer is formed by: performing a atomic layer deposition cycles of transition metal precursor at a first deposition temperature between 100° C. and 300° C.; and performing b atomic layer deposition cycles of a second precursor at a second deposition temperature between 50° C. and 300° C. The method further includes forming a transition metal dichalcogenide by sulphurization of the ultra-thin transition metal layer.

A method of preparing a substrate comprising forming a transition metal layer of x atomic layers by repeating x, wherein x is between 1 and 8 times a atomic layer deposition ("ALD") process. The ALD process has the steps of: performing a atomic layer deposition cycles of transition metal precursor at a first deposition temperature between 100° C. and 300° C. and performing b atomic layer deposition cycles of a second precursor at a second deposition temperature between 50° C. and 300° C. The method further includes converting the transition metal layer to dichalcogenide by sulphurization of the transition metal layer at a temperature of at least greater than or equal to 300° C.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are, therefore, not to be considered limiting of its scope, the disclosure will be described with additional specificity and detail through use of the accompanying drawings.

FIG. 4A shows overall trench substrate geometry, and FIG. 4B shows zoomed-in areas of regions (top, middle, and bottom) of trench where clearly layered growth of $MoS_2$ is visible.

FIG. 6A shows a Mo3d/S2s region, and FIG. 6B shows a S2p region.

FIG. 7A shows UV-Vis transmittance spectra for 3 cycles and 8 cycles of Mo converted $MoS_2$ films on quartz substrates, and FIG. 7B shows a Tauc plot for a 3 cycles $MoS_2$ film on quartz.

Figure 1:
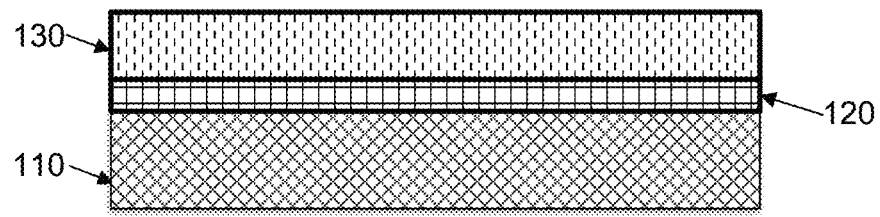
FIG. 1 shows one embodiment of a transition metal thin layer deposited on a seed layer prior to sulphurization.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate to a method of forming ultra-thin, few-layer TMD. As described further herein, the embodiments utilize a different approach to fabrication of ultra-thin, few-layer TMD. The inventors have taken a different approach to replace the top-down approach with a bottom-up approach to grow ultra-thin TMD films ranging from 1 to 8 layers. $MoS_2$ is considered as the material for study in this case. ALD is used to grow monolayers of Molybdenum metal on various substrates, which is then sulphurized with $H_2S$ gas to obtain ultra-thin layers of $MoS_2$ films. ALD is a vapor-phase, thin-film deposition method based on alternating self-limiting surface reactions. ALD typically uses gaseous precursors to react with the exposed surface (first of a substrate, then of preceding layers). The precursors are selected such that the first precursor binds to the substrate and then is modified by reaction with the second precursor to leave the desired element or compound. Each precursor may be applied as a continuous exposure for a period of time or may be applied as micropulses of very short duration extending over a period of time. Flushing the reaction chamber with a purge gas for a given time is utilized to ensure termination of the reaction as well as to prevent undesired reactions when the subsequent precursor is injected. The nature of ALD lends itself to be a unique deposition method capable of precise control over thin film thickness and stoichiometry and capable of depositing conformal coatings over high surface area morphologies.

FIG. 1 illustrates one embodiment of an ultra-thin film TMD, including a substrate layer 110 (which may be sacrificial), a seed layer 120 (optional in some embodiments), and a TMD layer 130, as described further below.

TMDs can be represented as $MX_2$, where M is a transition metal and X is a chalcogenide. TMDs have a layered structure where each layer consists of an X-M-X unit. TMD crystals are typically described as having trigonal or octahedral prismatic coordination to help describe the material in a single layer, where each M atom has six X atoms forming a hexagon above and below it. These atomic trilayers feature strong in-plane covalent bonding but weak van der Waals bonding between layers. This dichotomy of bonding characteristics facilitates the synthesis and isolation of single layer TMDs. $MoS_2$ in the bulk crystalline form has three stable phases under standard conditions: 2H, 3R, and 1T.

One embodiment relates to a method of forming transition metal films on a substrate via ALD by performing a atomic layer deposition exposures of a transition metal precursor at a first deposition temperature between 100° C. and 300° C. A second precursor exposure is carried out, performing b atomic layer deposition exposures of a reducing precursor at a second deposition temperature between 50° C. and 300° C. and forming a transition metal coating on the substrate. The a and b exposures constitute one ALD cycle for the deposition of the transition metal. A purge gas is used after completing each precursor exposure, for example after the first precursor exposure and after the second precursor exposure. In one example, the first precursor exposure is for 2 seconds at 100 miliTorr. The second precursor exposure is for 2 seconds at 210 miliTorr. The transition metal coating can be made thicker by performing additional ALD cycles. In one embodiment, the transition metal coating is ultra-thin, such as 1-8 atomic layers, in one particular implementation 1-3 atomic layers. It should be appreciated that the ALD transition metal films' growth, as well as optimal temperature, will vary based on the precursor sublimation temperature and the stability.

In one embodiment, the transition metal is molybdenum. In such embodiments, Mo metal can be grown at 200° C. using molybdenum hexafluoride ($MoF_6$) as the first precursor (the transition metal precursor) and disilane ($Si_2H_6$) as the second precursor (the reducing precursor). In a second example, W metal can grow using $WF_6$ as the transition metal and $Si_2H_6$ as the reducing precursors respectively. TMDs, of $MX_2$ structures, can thus be successfully obtained by sulfurizing ultra thin transition metal films deposited by ALD. Examples of obtainable TMDs following the general structure $MX_2$ where M=transition metal elements are those having X=S, Se, and Te.

Following the ALD process, an ultra-thin layer of transition metal exists on the substrate. The ultra-thin layer of transition metal undergoes a sulphurization by exposure to a sulfur compound at an elevated temperature, relative to the ALD reaction temperature. For example, gaseous $H_2S$ is the sulfur compound in one embodiment but can include elemental sulfur, dimethylsulfide, and bis(trimethylsilyl)sulfide. As noted, the sulphurization occurs at an elevated temperature, ranging from 300° C. to 600° C., independent of the TMD. In one embodiment, the sulphurization step proceeds until the transition metal has been completely converted to TMD. In the example embodiments, the sulphurization step was carried out for 30 minutes for complete conversion of the ultrathin metal films to TMD films as verified from XPS measurements.

In one embodiment, the substrate is a silicon substrate. The substrate may be chosen to be a sacrificial substrate. Other substrates like MgO, $Al_2O_3$, and quartz were also used.

The ability of depositing the transition metal on multiple surfaces allows for multiple applications, such as, but not limited to, battery coatings (on both anode and cathode), catalytic surfaces, electronic devices, and hydrogen evolution.

In one embodiment, a seed layer is grown on the substrate prior to the deposition of the transition metal by ALD, as discussed above. For example, a seed layer of AlMoF is grown prior to deposition of transition metal. This seed layer is of the thickness of 1 nm and allows faster nucleation and adherence of the metal layer on the Si substrate. The precursors used to grow AlMoF are TMA and $MoF_6$. In one embodiment, the ultra-thin metal (Mo) layer is deposited on the seed layer. The purpose of seed layer is to start the nucleation for the transition metal layer deposition as quick as possible. For example, Won $Al_2O_3$ has 8-9 cycle's nucleation delay, whereas Mo on AlMoF starts to grow after once cycle. Therefore, by adding suitable nucleation layer selected to match the transition metal and/or transition metal precursor being utilized, it is possible to grow material very quickly. Another aspect of the nucleation layer is that especially fluorinated precursors ($MoF_6$ and $WF_6$) are very reactive to Si Surface and can form $WSi_x$ or $MoSi_x$, which may have issues converting as TMDs and adhering a Mo or W layer on Si surface caused by $SiF_x$ species. If we add one cycle of TMA-$MF_x$ (M=W and Mo), then we can start nucleation of metal Mo and W very quickly. This TMA-$MF_x$-based nucleation layer also improves the adhesion of metal (Mo and W) to a great extent.

The background pressures used during the ALD, that is to say the pressure when no precursor is being dosed, can be in the range of $1e^{-10}$ Torr to 1000 Torr (e.g., $1e^{-10}$, $1e^{-8}$, $1e^{-6}$, $1e^{-4}$, $1e^{-3}$, 0.01, 0.1, 1, 10, 100, or 1000 Torr, inclusive of all ranges and values between). The first predetermined time can be in the range of 0.1 second to 500 seconds (e.g., 0.1, 0.5, 1, 5, 10, 20, 30, 40, 50, 60, 70, 80, 90, 100, 120, 140, 160, 180, 200, 220, 240, 260, 280, 300, 350, 400, 450, or 500 seconds, inclusive of all ranges and values between). In some embodiments, the first predetermined time is in the range of 0.1 and 10 seconds, for example about 5 seconds. The first partial pressure of the first metal precursor can be in the range of 0.01 Torr to 10 Torr. (e.g., 0.01, 0.05, 0.1, 0.5, 1.0, 5.0, or 10 Torr, inclusive of all ranges and values therebetween). In certain embodiments, the transition metal (Mo) was deposited at a base pressure of 0.9 Torr, and the partial pressures of $MoF_6$ and $Si_2H_6$ were 0.1 Torr and 0.21 Torr, respectively, as 2 second pulses each. During sulphurization, 1.5 Torr of $H_2S$ was dosed as pulses for 10 seconds.

In some embodiments, the ALD reactor and/or substrate material can be heated to a predetermined temperature during the ALD process. For example, the first predetermined temperature can be in the range of 25° C. to 450° C. (e.g., 25, 30, 40, 50, 60, 70, 80, 90, 100, 110, 120, 130, 140, 150, 160, 170, 180, 190, 200, 250, 300, 300, 350, 400, or 450° C., inclusive of all ranges and values there between). In this case, due to sufficiently high vapor pressure of all the precursors at room temperature, additional heating of the precursors was not needed. In certain embodiments, the temperature range was maintained between 100° C. to 400° C.

Between the precursor exposures, the ALD reactor may be evacuated or purged with inert gas for a fixed time to remove or sweep away any unreacted precursor of gaseous reaction product. The purge times may be in the range of 0.1 second to 500 seconds (e.g., 0.1, 0.5, 1, 5, 10, 20, 30, 40, 50, 60, 70, 80, 90, 100, 120, 140, 160, 180, 200, 220, 240, 260, 280, 300, 350, 400, 450, or 500 seconds, inclusive of all ranges and values between). In one embodiment, longer purge times are used (20 seconds or greater) to provide sufficient time to purge the remaining precursors and byproducts thus avoiding any CVD reaction occurring in the ALD reactor.

Experimental Details

Experimental data was gathered from performing certain embodiments of the process for growing ultra-thin TMD. Table 1 below indicates the experimental conditions utilized as further described below.

Figure 7A:
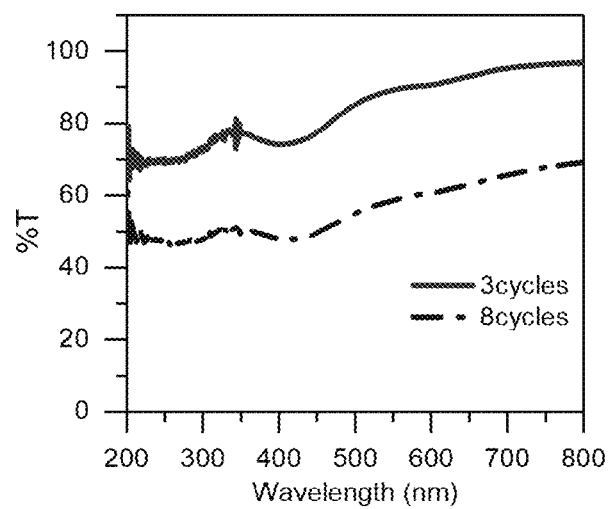
FIGS. 7A-7B show optical properties of $MoS_2$ films.
Figure 7B:
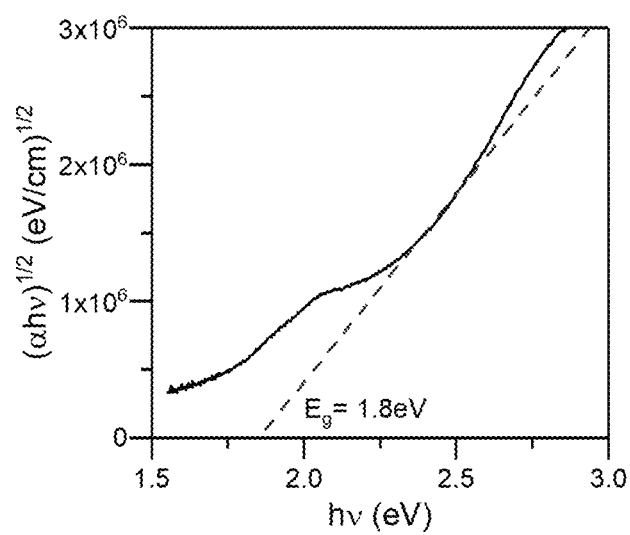
Figures 8A, 8B:
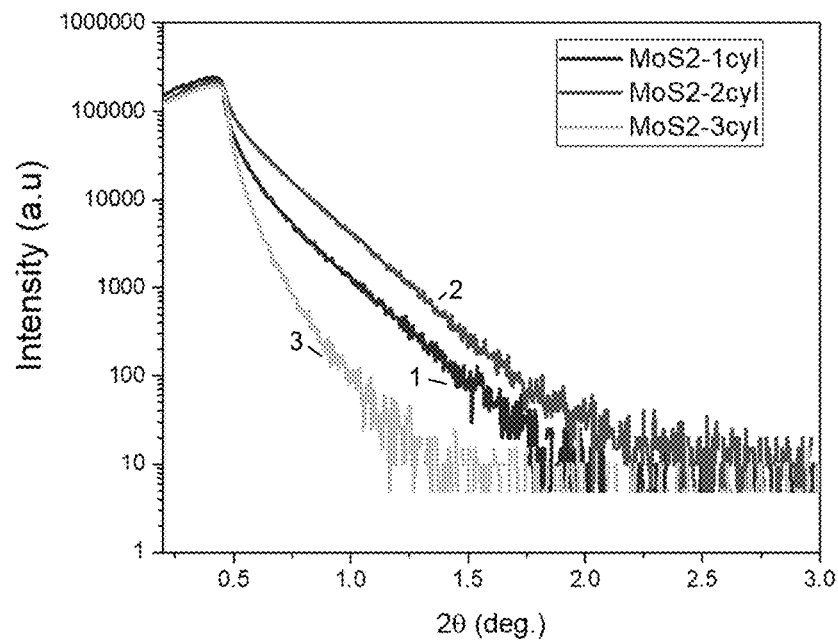
FIG. 8A is an X-ray reflectivity ("XRR") analysis of $MoS_2$ samples grown with 1, 2, and 3 cycles of Mo deposited on $Al_2O_3$//Si.
FIG. 8B is calculated density, thickness, and roughness, for 1, 2, and 3 cycles of Mo deposited on fix $Al_2O_3$//Si.

The growth rate of the ALD $MoS_2$ under steady state is ~0.5 Å/cycle. Considering the bulk density of $MoS_2$ is 5.06 $g/cm^3$, this results in a mass deposition of 45 $ng/cm^2$ as measured by the QCM for each cycle of $MoS_2$ growth. Therefore, the total mass deposited after 3 $MoS_2$ cycles is 135 $ng/cm^2$. In the method used in one embodiment, on the other hand, a total mass of 950 $ng/cm^2$ was deposited with 3 cycles of Mo metal. Considering the bulk density of Mo to be 10.2 $g/cm^3$, this results in an overall thickness of 10 Å Mo film, ~3 Å/cycle. As seen in FIGS. 7A-7B, the total thickness for $MoS_2$ conversion for 3 cycle Mo+suphurisation case is found to be 7 A with 2 A of un-sulphurised Mo layer lying underneath. The incomplete sulphurization can be due to the complex AlMOF forms with the $Al_2O_3$/Si which can be very stable, and remain unaffected during the sulphurization process. Nonetheless, the conversion of Mo to $MoS_2$ can be carried out in a controlled manner. An increase in sulphurization time can result in complete conversion of the metal Mo layer.

TABLE 1

| No | Parameters | Values |
|----|-----------|--------|
| 1 | Precursors for Mo growth | $MoF_6$ and $Si_2H_6$ |
| 2 | Nucleation layer precursors | TMA-$MoF_6$ |
| 3 | Number of ALD cycles | 1-8 |
| 4 | Timing sequence ($MoF_6$—$N_2$—$Si_2H_6$—$N_2$) | Optimized (2-10-2-10)s |
| 5 | Deposition Temperature | 200° C. |
| 6 | Purge Gas ($N_2$ flow) | 300 sccm |
| 7 | Thermal Annealing | $H_2S$ 400° C. (Higher temperature may be used for more efficient conversion of Mo to $MoS_2$) |

Molybdenum metal was deposited in a viscous flow ALD reactor at 200° C. using molybdenum hexafluoride ($MoF_6$) and disilane ($S_2H_6$) precursors. Both precursors were maintained at room temperature due to their sufficiently high vapor pressure and dosed into the reactor through differentially heated lines. Using the ALD process, 1 to 8 cycles of $MoF_6$—$Si_2H_6$ were exposed to grow Mo films following surface chemistry in a viscous flow ALD reactor. $MoF_6$ is reduced readily by both Si and $H_2$ to form Mo metal films:

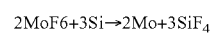

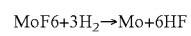

Figure 2:
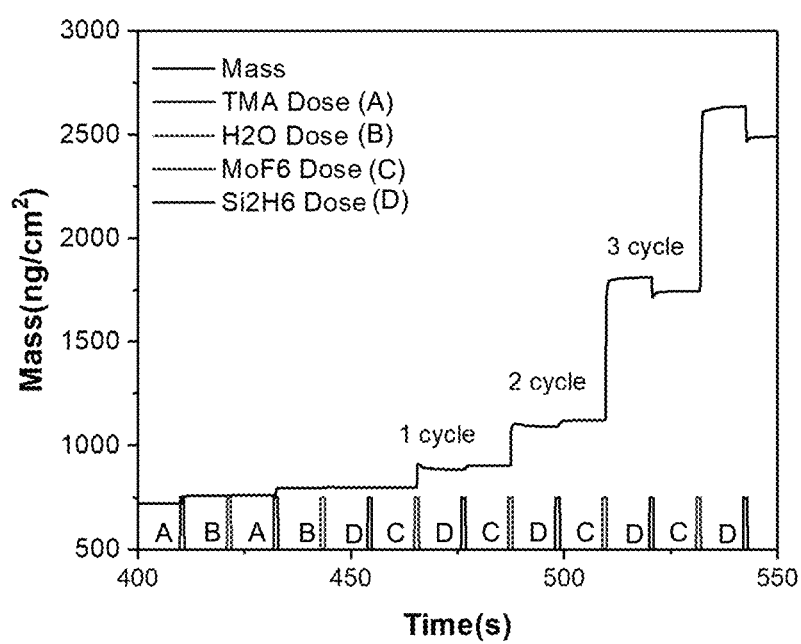
FIG. 2 is a graph of mass gain per cycle during first three cycles of Mo deposition at 200° C. as measured by quartz crystal microbalance ("QCM").

In-situ quartz crystal measurements were carried out to measure the mass change during each half-reactions and thus obtain the net mass change per cycle. FIG. 2 shows the mass change of the first 3 cycles of Mo growth on aluminum oxide surface. As shown, due to nucleation on the starting surface, the mass gain increases with increasing cycles before reaching a steady state growth. However, in this work, since we aim to limit our study to ultra-thin monolayer films, the initial few cycles are the most important. Mass gains per cycle ("MGPC") were found to be 105.8 ng/cm$^2$, 215.2 ng/cm$^2$ and 622.2 ng/cm$^2$ in the first, second, and third cycles, respectively. Thus, the total mass gain after 3 cycles of $MoF_6$—$Si_2H_6$ was 943.2 ng/cm$^2$. This deposited Mo mass is extremely crucial to calculate the percentage of metal converted to sulphide later on.

After Mo metal film deposition of various cycles, the substrates were subjected to a higher temperature of 400° C. without compromising the vacuum in the ALD reactor. $H_2S$ gas with a partial pressure of 1.5 Torr was introduced into the reactor for 30 mins. After sulphurisation, the reactor was cooled to 80° C. before removing the substrate from the reactor.

Experimental Results

XPS, raman spectroscopy, X-ray UV-Vis spectroscopy are used to prove the formation of $MoS_2$ in this experiment. Raman and X-ray photoelectron spectroscopy were carried out to study the efficient conversion of Mo metal to $MoS_2$ films. FIG. 2 shows the Raman spectra of films deposited on Si and MgO substrates. While Si substrates possess a thin layer of native oxide (20 Å), the MgO is a single crystal substrate. Different substrates were used to show the independence of this sulphurization technique from the underlying material. Raman spectra was recorded using a 514 nm excitation laser.

Figure 3A:
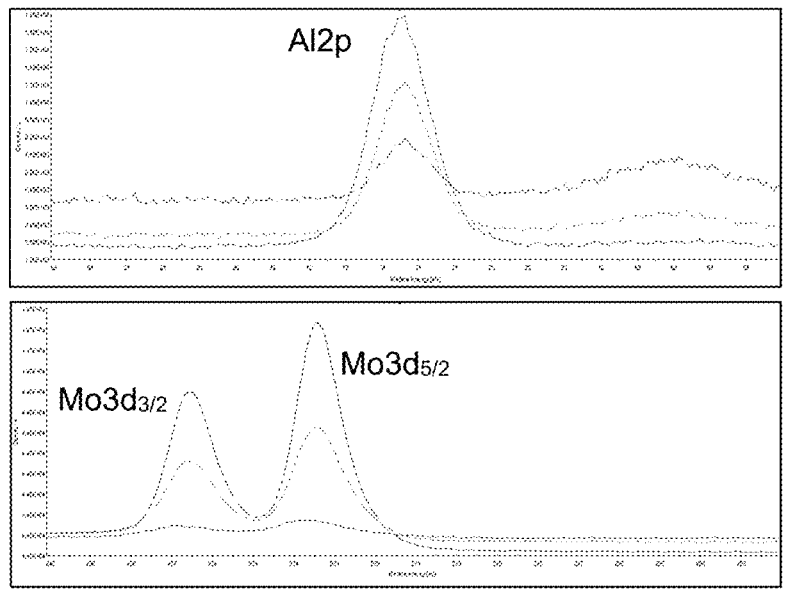
FIG. 3A is an X-ray photoelectron spectroscopy ("XPS") analysis of Al2p and Mo3d spectra for 1, 2 and 3 cycles of Mo deposited on $Al_2O_3$/Si.
Figure 3B:
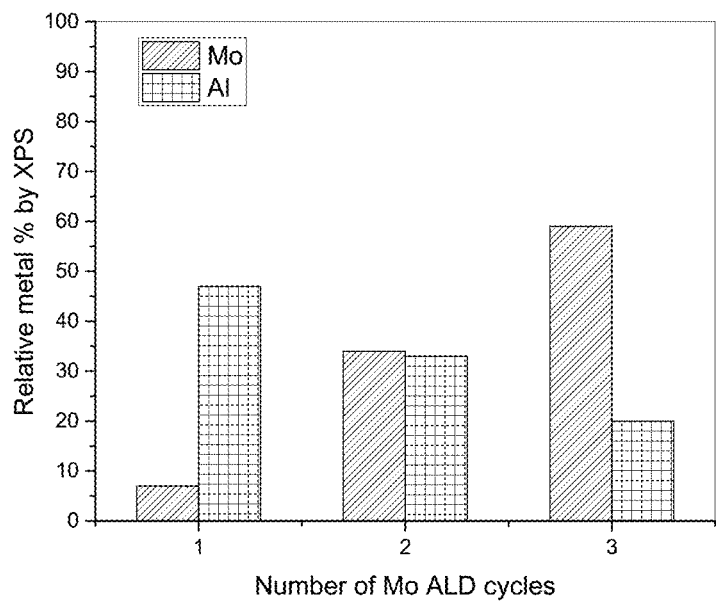
FIG. 3B is metal atomic percentage calculated from the XPS analysis for 1, 2, and 3 cycles of Mo deposited on fix $Al_2O_3$/Si.

The Raman spectrum of bulk $MoS_2$ has two prominent peaks: an in-plane ($E_{2g}$) mode located around 383 cm$^{-1}$ and an out-of-plane ($A_{1g}$) mode which is located at 407 cm$^{-1}$. The in-plane mode corresponds to the sulphur atoms vibrating in one direction and the Molybdenum atom in the other, while the out-of-plane mode is a mode of just the sulphur atoms vibrating out of plane. FIG. 3A shows that while 3, 6, and 8 cycles of Mo after sulphurization with $H_2S$ showed characteristic 2D $MoS_2$ peaks, the 2-cycle Mo sulphurized sample does not. On the other hand, a weak peak was observed around 500 cm$^{-1}$. This suggested that probably due to nucleation and formation of less than a monolayer of Mo metal film, the $H_2S$ sulphurization process was unable to produce stoichiometric $MoS_2$ or the resulting film lacks in short-range order.

Figure 4A:
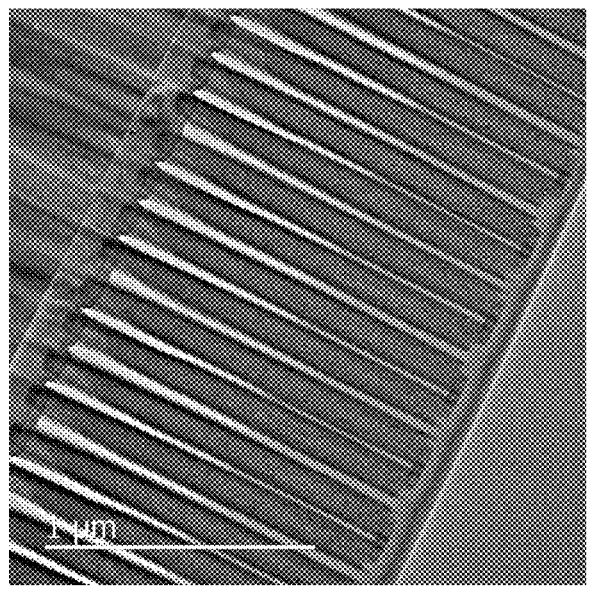
FIGS. 4A-4B are Transmission electron microscopy images of $MoS_2$ made using (3 cycles Mo ALD+sulphurized) on high aspect ratio trench substrate.
Figure 4B:
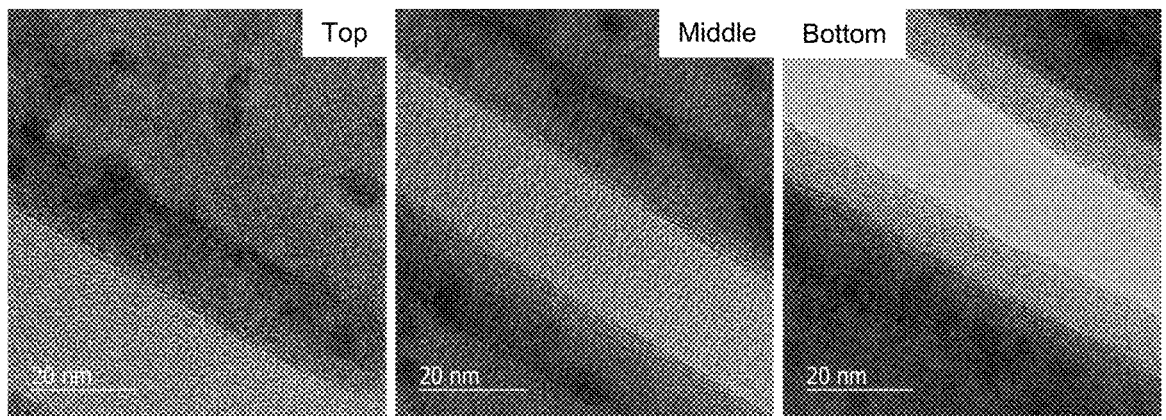

High resolution XPS spectra also confirm the formation of $MoS_2$ after sulphurization of the ALD grown Mo metal films as shown in FIGS. 4A-4B. The Mo3d region of the spectra (FIG. 3A) showed a doublet corresponding to $Mo3d_{5/2}$ at 228.6 eV and $Mo3d_{3/2}$ at 231.8 eV for $MoS_2$. In addition, some amount of molybdenum was also found in the oxidized state in the form of $MoO_3$ with binding energies at 230 eV and 234 eV for $Mo3d_{5/2}$ and $Mo3d_{3/2}$. The S 2s peak was also observed near the Mo 3d doublet at 225 eV which is in good agreement with the binding energy of $S^{2-}$ in $MoS_2$.

Binding energies of $S2p_{3/2}$ and $S2p_{1/2}$ were observed at 161.6 eV and 162.7 eV, respectively (FIG. 4B). These lie within the range of values reported previously for $MoS_2$. Similar composition was also found for films on MgO substrate, again proving the substrate independence of this technique.

Figure 5A:
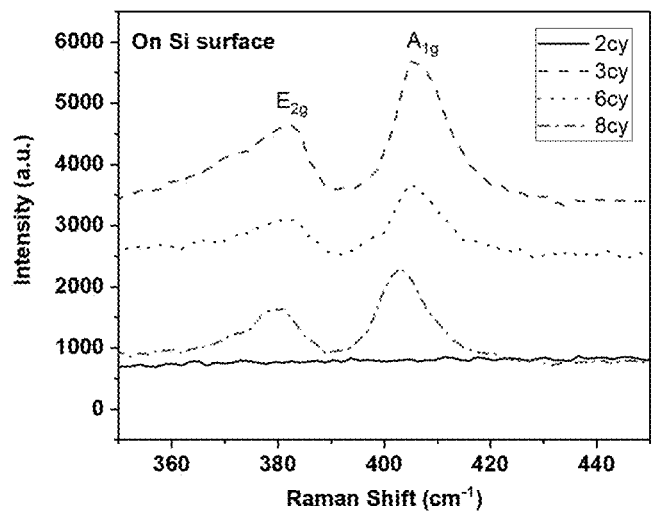
FIG. 5A is a Raman Spectroscopy of 2, 3, 6, and 8 cycles of Mo sulphurised to $MoS_2$ on Si.
Figure 5B:
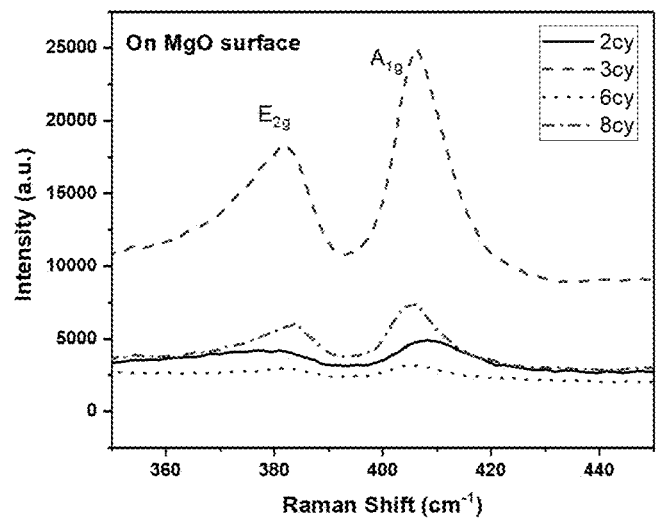
FIG. 5B is a Raman Spectroscopy of 2, 3, 6, and 8 cycles of MgO substrates.

FIG. 5A shows transmission data of the 3 cycles and 8 cycles of Mo sulphurized to $MoS_2$ measured over the visible spectrum. A tauc plot showed an indirect bandgap of 1.8 eV for 3 cycles of $MoS_2$. This is in general agreement with the ultra-thin layers of $MoS_2$, thus fulfilling our aim here. With thicker layers (5-50 nm), bandgap reduces to the range 1.3-1.5 eV.

Figure 6A:
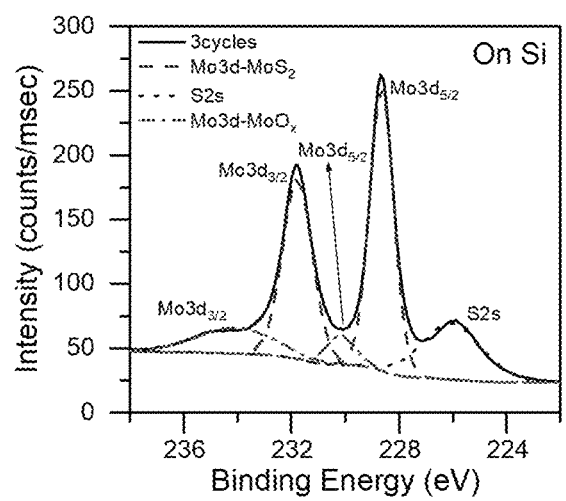
FIGS. 6A-6B are X-ray photoelectron spectra of 3 cycles of $MoS_2$ sample.
Figure 6B:
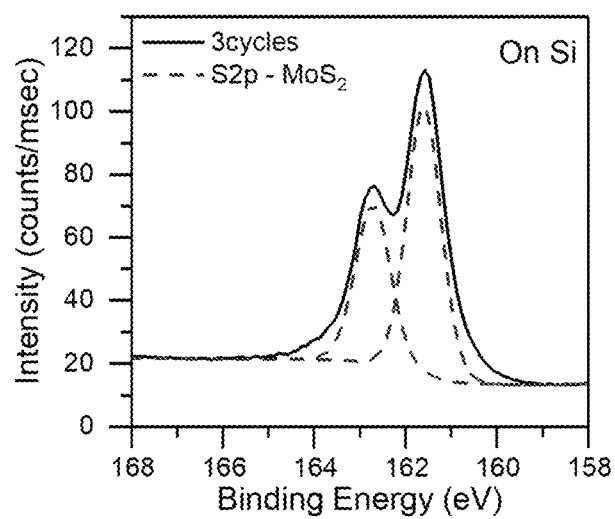

FIGS. 6A-6B show. optical properties of $MoS_2$ films: UV-Vis transmittance spectra for 3 cycles and 8 cycles of Mo converted $MoS_2$ films on quartz substrates (FIG. 6A) and Tauc plot for a 3 cycles $MoS_2$ film on quartz (FIG. 6B).

Conclusion

Ultra-thin layers of $MoS_2$ were obtained here using atomic layer deposition in the bottom-up approach. Mo films were first deposited by ALD at 200° C., and then sulphurised in $H_2S$ environment at an elevated temperature of 400° C. Raman and XPS spectroscopy proved the formation of $MoS_2$ layers. The $MoS_2$ layers formed were also found to be independent of the underlying substrates. UV-VIS spectroscopy confirmed an indirect bandgap of 1.8 eV for these films.

A preferred method to deposit catalyst thin film on a MCNO (Mn—Co—Ni—O) substrate is to use ALD. ALD is unique in its ability to create ultra-thin films of metals (e.g., Pt, Ir, Ru) or other materials, such as transition metal oxides (e.g., $TiO_2$, $ZrO_2$), transition metal nitrides (e.g., TiN, TaN, WN), and chalcogenides (e.g., $MoS_2$, $Al_2S_3$, $Cu_2S$) on powdered substrates to make catalytic objects based on ThinFilm/MCNO.

Physical vapor deposition techniques, including sputtering and electron beam deposition, are not suited to particle coatings as they are line-of-sight dependent. Chemical vapor deposition techniques are not self-limiting and therefore result in much thicker films (hundreds of nanometers).

Wet chemical techniques have clearly been developed for the deposition of platinum by the catalyst industry, but require significant energy input to remove the liquid phase after deposition. Also, unlike ALD films, which are covalently bonded to the surface, wet impregnation results in physisorption of the metal to the surface. This weak bonding causes the resulting catalyst structure to be in the form of nanoparticles and/or islands. These weakly bonded particles and islands can migrate and sinter, reducing the dispersion and effective surface area of the platinum. ALD Pt films have been shown to be more stable with time and temperature cycling because of the covalent bonding and also more catalytically active than Pt deposited by incipient wetness techniques. ALD utilizes a series of alternating surface reactions to deposit a film one atomic layer at a time. The key is that only one precursor is present in the reactor at a time, and that the precursor cannot react with itself. The result is self-limiting deposition with atomic layer control of a film that is covalently bonded to the surface. ALD is also line-of-sight independent. It will deposit anywhere that the precursors can diffuse in the gas phase.

Definitions

As used herein, the singular forms "a", "an," and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary," as used herein to describe various embodiments, is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes, and proportions of the various elements, values of parameters, mounting arrangements, use of materials, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed:

1. A method of preparing a substrate comprising:
    depositing a seed layer on the substrate, the seed layer comprising AlMoF;
    forming an ultra-thin transition metal layer by:
        performing a atomic layer deposition cycles of transition metal precursor at a first deposition temperature between 100° C. and 300° C., and
        performing b atomic layer deposition cycles of a second precursor at a second deposition temperature between 50° C. and 300° C., and
    forming a transition metal dichalcogenide by sulphurization of the ultra-thin transition metal layer by exposure to a sulfur precursor.

2. The method of claim 1, wherein sulphurization further comprises thermally annealing the ultra-thin transition metal layer at a sulphurization temperature.

3. The method of claim 1, wherein the transition metal precursor for a atomic layer deposition is $MoF_6$ and, the precursor for b atomic layer deposition is $Si_2H_6$ and the sulfur precursor is $H_2S$ further wherein the transition metal dichalcogenide is $MoS_2$.

4. The method of claim 1, wherein the a cycles each comprise: a 1 second dose followed by a gas purge.

5. The method of claim 2, wherein the b cycle depositions each comprise: a 1 second dose followed by a 1 second gas purge.

6. The method of claim 2, wherein the sulphurization temperature is greater than 300° C. and less than 600° C.

7. The method of claim 5, wherein sulphurization further comprises exposing the transition metal layer to $H_2S$.

8. The method of claim 5, wherein the ultra-thin transition metal layer is deposited on a substrate before sulphurization.

9. The method of claim 1, wherein the seed layer comprises a material different from the ultra-thin transition metal layer and the substrate and wherein the seed layer is 1nm thick.

10. A method of preparing a substrate comprising:
    depositing a seed layer on the substrate, the seed layer comprising AlMoF;
    forming a transition metal layer of x atomic layers by repeating x times a atomic layer deposition process having the steps of:
        performing a atomic layer deposition cycles of transition metal precursor at a first deposition temperature between 100° C. and 300° C., and
        performing b atomic layer deposition cycles of a second precursor at a second deposition temperature between 50° C. and 300° C., and
    converting the transition metal layer to dichalcogenide by sulphurization of the transition metal layer at a temperature of at least greater than or equal to 300° C. by exposure to at least one dose of a sulfur precursor,
    wherein x is between 1 and 8.

11. The method of claim 10, wherein the transition metal precursor is $MoF_6$ and $Si_2H_6$ further, the transition metal dichalcogenide is $MoS_2$, and the sulfur precursor is $H_2S$.

12. The method of claim 10, wherein the a cycles each comprise: a 1 second dose followed by a gas purge.

13. The method of claim 10, wherein the b cycle depositions each comprise: a 1 second dose followed by a second gas purge.

14. The method of claim 10, wherein the sulfur precursor comprises $H_2S$.

15. The method of claim 10, wherein the sulphurization temperature is between 300° C. and 600° C.

16. The method of claim 15 wherein the sulphurization is by 10 second doses of $H_2S$ exposure at a pressure of at least 1.5 Torr.

* * * * *